(12) United States Patent
Miyatani et al.

(10) Patent No.: US 11,674,214 B2
(45) Date of Patent: Jun. 13, 2023

(54) DEPOSITION MASK AND METHOD OF MANUFACTURING DEPOSITION MASK

(71) Applicant: Dai Nippon Printing Co., Ltd., Tokyo (JP)

(72) Inventors: Isao Miyatani, Tokyo (JP); Daigo Aoki, Tokyo (JP); Masato Ushikusa, Tokyo (JP); Yoshinori Murata, Tokyo (JP); Hideyuki Okamoto, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 115 days.

(21) Appl. No.: 16/855,016

(22) Filed: Apr. 22, 2020

(65) Prior Publication Data

US 2020/0291509 A1 Sep. 17, 2020

Related U.S. Application Data

(63) Continuation of application No. PCT/JP2018/038495, filed on Oct. 16, 2018.

(30) Foreign Application Priority Data

Oct. 27, 2017 (JP) .............................. JP2017-208569

(51) Int. Cl.
 *C23C 14/04* (2006.01)
 *C23C 14/20* (2006.01)
 *H10K 71/16* (2023.01)
 *H10K 71/00* (2023.01)

(52) U.S. Cl.
 CPC ............ *C23C 14/042* (2013.01); *C23C 14/20* (2013.01); *H10K 71/166* (2023.02); *H10K 71/00* (2023.02)

(58) Field of Classification Search
 CPC .......................... C23C 14/042; H01L 51/0011
 See application file for complete search history.

(56) References Cited

U.S. PATENT DOCUMENTS

| 5,415,753 A * | 5/1995 | Hurwitt ............... C23C 14/0068 |
| | | 204/192.12 |
| 2003/0054646 A1 | 3/2003 | Yotsuya |
| 2005/0123676 A1 | 6/2005 | Kuwahara et al. |

(Continued)

FOREIGN PATENT DOCUMENTS

| CN | 106133182 A | 11/2016 |
| CN | 107208251 A | 9/2017 |

(Continued)

OTHER PUBLICATIONS

English Translation of the International Preliminary Report on Patentability (Chapter I) (Application No. PCT/JP2018/038495) dated May 7, 2020.

(Continued)

*Primary Examiner* — Keath T Chen
(74) *Attorney, Agent, or Firm* — Burr Patent Law, PLLC

(57) ABSTRACT

A deposition mask includes an effective part in which a plurality of openings are provided, and an outer frame part surrounding the effective part. The effective part includes an outer peripheral area that is adjacent to the outer frame part, and a central area which is surrounded by the outer peripheral area and has a thickness larger than a thickness of the outer peripheral area.

8 Claims, 11 Drawing Sheets

(56) References Cited

U.S. PATENT DOCUMENTS

2014/0033974 A1\* 2/2014 Hong .................... B05C 21/005
                                                    118/500
2016/0208392 A1\* 7/2016 Ikenaga ................ C23C 14/042
2018/0334740 A1 11/2018 Ikenaga et al.

FOREIGN PATENT DOCUMENTS

| EP | 1 531 188 A2 | 5/2005 | |
|----|----|----|----|
| JP | S52-068555 A | 6/1977 | |
| JP | 2001-234385 A1 | 8/2001 | |
| JP | 2005-146361 A1 | 6/2009 | |
| TW | 201640220 A | 11/2016 | |
| WO | WO 2015146544 | \* 10/2015 | .......... H01L 51/0011 |
| WO | 2017/057621 A1 | 4/2017 | |

OTHER PUBLICATIONS

Extended European Search Report (Application No. 18870591.7) dated Jul. 28, 2021.
International Search Report and Written Opinion (Application No. PCT/JP2018/03 8495) dated Dec. 4, 2018.
Chinese Office Action (Application No. 201811257266.9) dated Jun. 28, 2020 (with English translation).
Chinese Office Action (Application No. 201811257266.9) dated Aug. 3, 2021 (with English translation).
Taiwanese Office Action (Application No. 107137678) dated Oct. 29, 2021 (with English translation).

\* cited by examiner

|  | Average value T2 of thicknesses of central area[μm] | Average value T1 of thicknesses of outer peripheral area[μm] | 3 × Standard deviation [μm] | Maximum value of deviation amounts of positions[μm] |
| --- | --- | --- | --- | --- |
| Example 1 | 3.5 | 3.1 | 1.6 | 3.8 |
| Example 2 | 3.5 | 3.1 | 2.4 | 5.3 |
| Comparative Example 1 | 3.5 | 3.5 | 1.5 | 5.5 |
| Example 3 | 5.6 | 4.9 | 2.5 | 4.2 |
| Example 4 | 5.6 | 4.9 | 3.1 | 6.2 |
| Comparative Example 2 | 5.6 | 5.6 | 2.6 | 6.4 |
| Example 5 | 9.8 | 9.0 | 4.0 | 4.6 |
| Example 6 | 9.8 | 9.1 | 5.4 | 7.4 |
| Comparative Example 3 | 9.8 | 9.8 | 4.3 | 7.8 |

DEPOSITION MASK AND METHOD OF MANUFACTURING DEPOSITION MASK

CROSS-REFERENCE TO RELATED APPLICATIONS

This application is a continuation application of International Application No. PCT/JP2018/38495, filed on Oct. 16, 2018, which claims the benefit of priority from Japanese Patent Application No. 2017-208569, filed on Oct. 27, 2017. The entire contents of these applications are incorporated herein by reference.

BACKGROUND

Field

Embodiments of the present disclosure relate to a deposition mask and a method of manufacturing a deposition mask.

Background Art

A display device used in a portable device such as a smart phone and a tablet PC is required to have high fineness, e.g., a pixel density of 400 ppi or more. There is increasing demand that the portable device is applicable to ultra-high definition (UHD). In this case, the pixel density of a display device is preferably 800 ppi or more.

Attention has been paid to an organic EL display device because of its excellent responsibility, low power consumption, and high contrast. A known method for forming pixels of an organic EL display device is a method which uses a deposition mask in which openings are formed and arranged in a desired pattern. Pixels in the desired pattern are formed by the method. To be specific, a deposition mask is firstly disposed to be opposed to a substrate for an organic EL display device. Then, the deposition mask and the substrate are put into a deposition apparatus, and a deposition step of depositing an organic material is performed.

As disclosed in Patent Document 1, for example, as a method of manufacturing a deposition mask, a method of manufacturing a deposition mask using a plating process is known. For example, in the method described in Patent Document 1, a matrix plate having an electrical conductivity is firstly prepared. Then, a resist pattern is formed on the matrix plate while making gaps in the resist pattern. The resist pattern is provided at a position where openings of a deposition mask are to be formed. Thereafter, a plating solution is supplied to the gaps of the resist pattern so as to precipitate a metal layer on the matrix plate by an electrolytic plating process. Thereafter, by separating the metal layer from the matrix plate, a deposition mask having openings formed therein can be obtained.

Patent Document 1: JP2001-234385A

SUMMARY

A deposition mask comprises an effective part including openings, and an outer frame part surrounding the effective part. The outer frame part is a part for supporting the effective part. The outer frame part has a rigidity higher than that of the effective part. For example, the outer frame part does not include openings. Alternatively, distribution density of openings in the outer frame part is lower than distribution density of openings in the effective part.

A metal layer of the deposition mask manufactured by a plating process has an inner stress caused by plating. As described above, since the effective part has more openings than those of the outer frame part, the inner stress generated in the effective part is smaller than the inner stress generated in the outer frame part. Thus, the effective part is subjected to a tensile force from the outer frame part. In this case, there is a possibility that positions of the openings are deviated because of uneven tensile forces and the like.

The object of the embodiment of the present disclosure is to provide a deposition mask and a manufacturing method thereof, capable of effectively solving such a problem.

One embodiment of the present disclosure is a deposition mask comprising:

an effective part including openings; and
an outer frame part surrounding the effective part;
wherein the effective part includes an outer peripheral area that is adjacent to the outer frame part, and a central area that is surrounded by the outer peripheral area and that has a thickness larger than a thickness of the outer peripheral area.

In the deposition mask according to the embodiment of the present disclosure, the effective part may include 9 areas which are obtained by virtually trisecting the effective part respectively along a first direction and a second direction orthogonal to the first direction, 8 areas out of the 9 areas, being adjacent to the outer frame part, may constitute the outer peripheral area, and the centrally located ninth area may constitute the central area.

In the deposition mask according to the embodiment of the present disclosure, when an average value of the thicknesses of the outer peripheral area is represented as T1, a standard deviation of the thicknesses of the outer peripheral area is represented as σ1, and an average value of the thicknesses of the central area is represented as T2, the following relational expressions may be satisfied:

$$T1 < T2; \text{ and}$$

$$3\sigma 1 < T2/2.$$

In the deposition mask according to the embodiment of the present disclosure, the average value T1 and the standard deviation σ1 of the thicknesses of the outer peripheral area may be calculated by measuring the thicknesses at 9 locations in each of the 8 areas constituting the outer peripheral area, and the average value T2 of the thickness of the central area may be calculated by measuring the thicknesses at 9 locations in the ninth area constituting the central area.

The deposition mask according to the embodiment of the present disclosure may include a first surface positioned toward a substrate onto which deposition material having passed through the openings is deposited, and a second surface positioned opposite to the first surface; and the opening may include a first opening positioned on the first surface and a second opening positioned on the second surface; and the second opening may include a profile surrounding a profile of the first opening, when seen along a normal direction of the first surface.

The deposition mask according to the embodiment of the present disclosure may comprise a metal layer comprising a first metal layer that is positioned on the first surface side and that includes the first opening formed therein, and a second metal layer that is positioned on the second surface side and that includes the second opening formed therein.

The deposition mask according to the embodiment of the present disclosure may comprise a metal layer including the openings formed therein; and a dimension of the opening of the metal layer in a plane direction of the first surface may decrease from the second surface side toward the first surface side.

In the deposition mask according to the embodiment of the present disclosure, the metal layer may be a plated layer.

The deposition mask according to the embodiment of the present disclosure may comprise a plurality of the effective parts arranged side by side along a first direction; and a thickness of the central area of one of the effective parts, the one being closest to an end of the deposition mask in the first direction, may be larger than a thickness of the central area of one other effective part being closest to a center of the deposition mask in the first direction.

One embodiment of the present disclosure is a method of manufacturing the aforementioned deposition mask, comprising a plating step of supplying a plating solution so as to form the outer peripheral area and the central area;

wherein the plating solution may be supplied through a shielding plate including a shielding part and a through-part, the shielding part being overlapped with the outer peripheral area, the through-part being overlapped with the central area.

According to the embodiment of the present disclosure, it is possible to reduce deviation of positions of openings.

DETAILED DESCRIPTION

Figure 1:
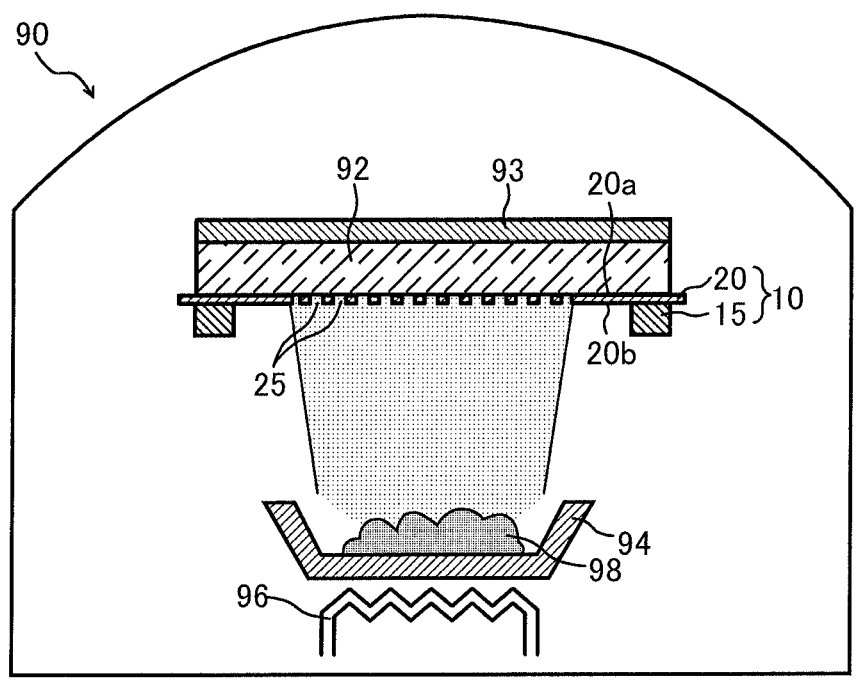
FIG. 1 is a view showing a deposition apparatus comprising a deposition mask apparatus according to one embodiment of the present disclosure.

Here below, an embodiment of the present disclosure is described with reference to the drawings. In the drawings attached to the specification, a scale dimension, an aspect ratio and so on are changed and exaggerated from the actual ones, for the convenience of easiness in illustration and understanding.

FIGS. 1 to 17 are views for describing an embodiment of the present disclosure. In the below embodiment and its modification example, a method of manufacturing a deposition mask for use in patterning an organic material on a substrate with a desired pattern, when an organic EL display device is manufactured, is described by way of example. However, not limited to such an application, the embodiment of the present disclosure can be applied to a method of manufacturing a deposition mask used in various purposes.

In this specification, terms "plate", "sheet" and "film" are not differentiated from one another based only on the difference of terms. For example, the "plate" is a concept including a member that can be referred to as sheet or film.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions and their degrees, e.g., "parallel", "orthogonal", "same", "equivalent" etc., and values of a length, an angle and a physical property are not limited to their strict definitions, but construed to include a range capable of exerting a similar function.

(Deposition Apparatus)

A deposition apparatus 90 that performs a deposition process of depositing deposition material onto an object is described with reference to FIG. 1. As shown in FIG. 1, the deposition apparatus 90 comprises a deposition source (e.g., crucible 94), a heater 96, and a deposition mask apparatus 10. The crucible 94 accommodates deposition material 98 such as an organic luminescent material. The heater 96 heats the crucible 94 so as to evaporate the deposition material 98. The deposition mask apparatus 10 is disposed to be opposed to the crucible 94.

(Deposition Mask Apparatus)

The deposition mask apparatus 10 is described. As shown in FIG. 1, the deposition mask apparatus 10 comprises a deposition mask 20 and a frame 15 that supports the deposition mask 20. The frame 15 supports the deposition mask 20 in a taut state in its plane direction, so that the deposition mask 20 is not bent. As shown in FIG. 1, the deposition mask apparatus 10 is disposed in the deposition apparatus 90 such that the deposition mask 20 faces a substrate. The substrate is an object onto which the deposition material 98 is deposited, such as an organic EL substrate 92. In the below description, a surface of the deposition mask 20, which is positioned toward the organic EL substrate 92, is referred to as a first surface 20$a$, and a surface positioned opposite to the first surface 20$a$ is referred to as a second surface 20$b$.

As shown in FIG. 1, the deposition mask apparatus 10 further comprises a magnet 93 disposed on a surface of the organic EL substrate 92, which is opposed to a surface of the substrate 92 facing the deposition mask 20. Due to the provision of the magnet 93, the deposition mask 20 can be attracted toward the magnet 93 so that the deposition mask 20 can be closely in contact with the organic EL substrate 92.

Figure 3:
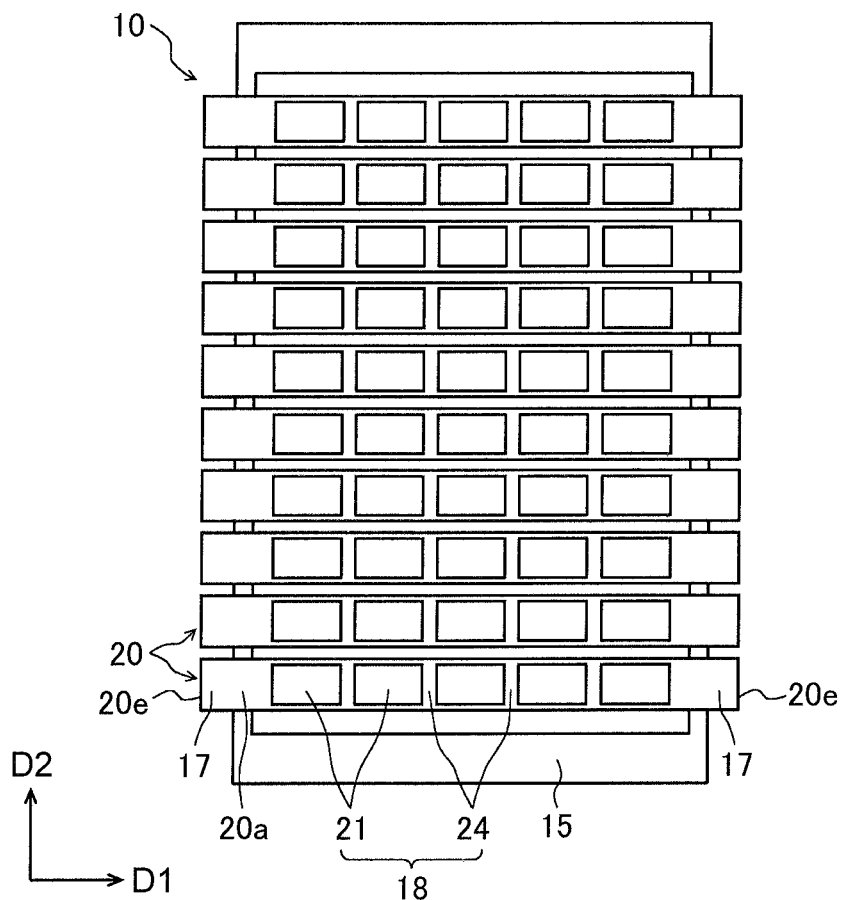
FIG. 3 is a plan view showing the deposition mask apparatus according to one embodiment of the present disclosure.

FIG. 3 is a plan view of the deposition mask apparatus 10 seen from the first surface 20$a$ side of the deposition mask 20. As shown in FIG. 3, the deposition mask apparatus 10 comprises a plurality of deposition masks 20 each having a substantially rectangular shape in plan view. Each deposition mask 20 is fixed to the frame 15 at a pair of longitudinal ends 20$e$ of the deposition mask 20 or at parts near thereto.

The deposition mask 20 has a plurality of openings passing through the deposition mask 20. The deposition material 98, which has evaporated from the crucible 94 to reach the deposition mask apparatus 10, adheres to the organic EL substrate 92 through the openings of the deposition mask 20. Thus, the deposition material 98 can be deposited on the surface of the organic EL substrate 92 in a desired pattern corresponding to the positions of the openings 25 of the deposition mask 20.

Figure 2:
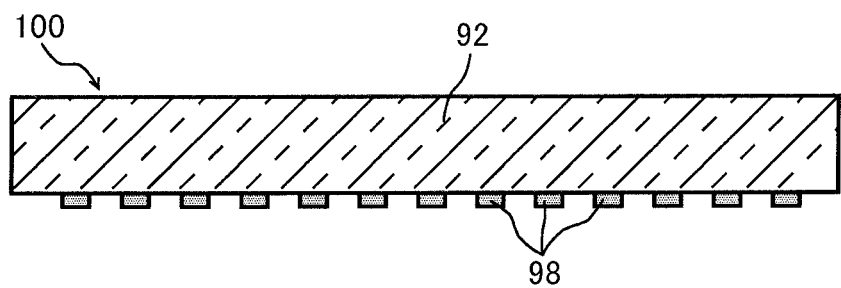
FIG. 2 is a sectional view showing an organic EL display device manufactured with the use of the deposition mask apparatus shown in FIG. 1.

FIG. 2 is a sectional view showing an organic EL display device 100 manufactured with the use of the deposition apparatus 90 of FIG. 1. The organic EL display device 100 comprises the organic EL substrate 92 and patterned pixels containing the deposition material 98.

When colored display by a plurality of colors is desired, the deposition apparatuses 90 provided with deposition masks 20 corresponding to respective colors are respectively prepared, and the organic EL substrate 92 is put into the respective deposition apparatuses 90 in sequence. Thus, for example an organic luminescence material for red color, an organic luminescence material for green color, and an organic luminescence material for blue color can be deposited onto the organic EL substrate 92 in sequence.

The deposition process is sometimes performed inside the deposition apparatus 90 in a high-temperature atmosphere. In this case, during the deposition process, the deposition masks 20, the frame 15 and the organic EL substrate 92, which are held inside the deposition apparatus 90, are also heated. At this time, each of deposition mask 20, the frame 15 and the organic EL substrate 92 develop dimensional change behaviors based on their respective thermal expansion coefficients. In this case, when the thermal expansion coefficients of the deposition mask 20 or the frame 15 and the organic EL substrate 92 largely differ from each another, positioning deviation occurs because of the difference in dimensional change. As a result, the dimensional precision and the positional precision of the deposition material to be adhered to the organic EL substrate 92 become lower.

In order to solve this problem, the thermal expansion coefficients of the deposition mask 20 and the frame 15 are preferably values equivalent to the thermal expansion coefficient of the organic EL substrate 92. For example, when a glass substrate is used as the organic EL substrate 92, an iron alloy containing nickel can be used as a main material of the deposition mask 20 and the frame 15. For example, an iron alloy containing nickel of 38% or more by mass and 62% or less by mass, balancing iron and inevitable impurities can be used as a metal material constituting the deposition mask 20. A content rate of nickel in the iron alloy constituting the deposition mask 20 and the frame 15 may be 40% or more by mass and 44% or less by mass.

As a material of a metal layer constituting the deposition mask 20, various materials other than the aforementioned iron alloy containing nickel can be used. For example, an iron alloy containing chrome, nickel, a nickel-cobalt alloy or the like can be used. As an iron alloy containing chrome, an iron alloy that is so-called stainless can be used.

(Deposition Mask)

The deposition mask 20 is described in detail. As shown in FIG. 3, the deposition mask 20 includes an effective part 21 and an outer frame part 24 surrounding the effective part 21. The effective part 21 is a part including a plurality of openings. The openings extend from the first surface 20$a$ to the second surface 20$b$ of the deposition mask 20. In the example shown in FIG. 3, the deposition mask 20 comprises a plurality of effective parts 21 arranged side by side along a first direction D1. The deposition mask 20 extends along the first direction D1. One effective part 21 corresponds to one display area of the organic EL display device 100. Thus, the deposition mask apparatus 10 shown in FIG. 3 can perform a multifaceted deposition for the organic EL display devices 100.

As shown in FIG. 3, the effective part 21 has a profile of a substantially quadrangular shape in plan view, more precisely a substantially rectangular shape in plan view. For example, the effective part 21 has a rectangular profile including a pair of sides extending in the first direction D1, and a pair of sides extending in a second direction D2 orthogonal to the first direction D1. Although not shown, each effective part 22 may have a profile of various shapes, depending on a shape of the display area of the organic EL substrate 92. For example, the effective part 22 may have a profile of a circular shape.

The outer frame part 24 is an area for supporting the effective part 21. The outer frame part 24 has a rigidity higher than that of the effective part 21. For example, the outer frame part 24 is not provided with openings. Alternatively, a distribution density of openings in the outer frame part 24 is lower than a distribution density of opening 25 in the effective part 21.

Figure 4:
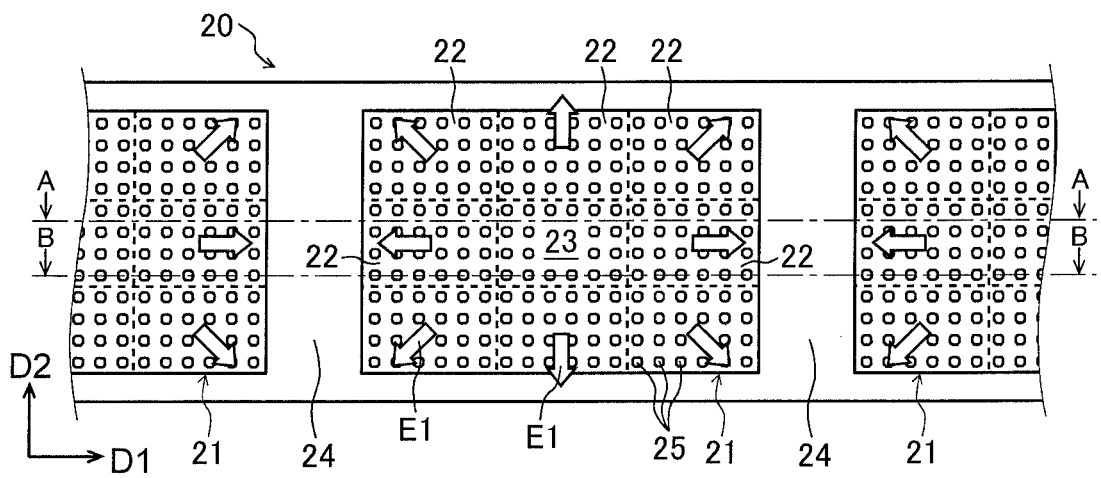
FIG. 4 is a plan view showing a part of the deposition mask in enlargement.

As described below, the deposition mask 20 includes a metal layer formed by a plating process. A problem that occurs in this case is described with reference to FIG. 4. FIG. 4 is a view showing a part of the deposition mask 20 in enlargement.

A metal layer of the deposition mask 20 manufactured by a plating process has an inner stress caused by plating. As described above, since the effective part 21 has more openings 25 than those of the outer frame part 24, the inner stress generated in the effective part 21 is smaller than the inner stress generated in the outer frame part 24. Thus, as shown by the arrows E1, the effective part 21 is subjected to tensile forces from the outer frame part 24. In this case, there is a possibility that positions of the though-holes 25 are deviated because of uneven tensile forces and the like.

In consideration of such a problem, this embodiment proposes that a thickness of a central area 23 of the effective part 21 is made larger than a thickness of an outer peripheral area 22 of the effective part 21. The outer peripheral area 22 is an area of the effective part 21, which is adjacent to the outer frame part 24. The central area 23 is an area that is surrounded by the outer peripheral area 22. For example, as shown in FIG. 4, when the effective part 21 is virtually trisected respectively along the first direction D1 and the second direction D2 so as to divide the effective part 21 into 9 areas, 8 areas adjacent to the outer frame part 24 constitute the outer peripheral area 22. The centrally located ninth area constitutes the central area 23.

Figure 5:
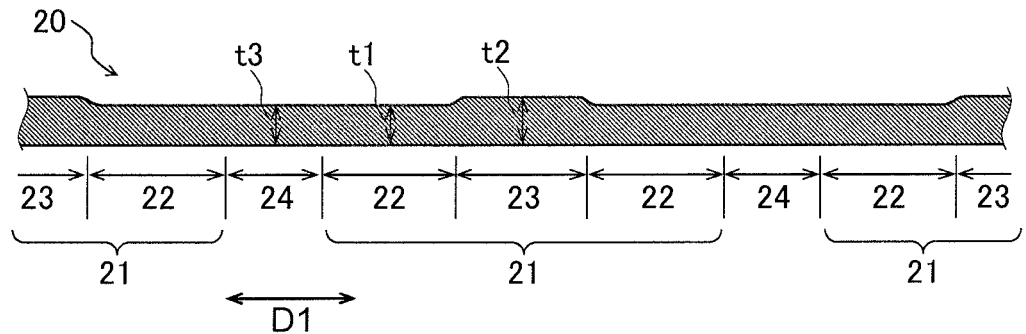
FIG. 5 is a sectional view of the deposition mask of FIG. 4 seen from the A-A direction.
Figure 6:
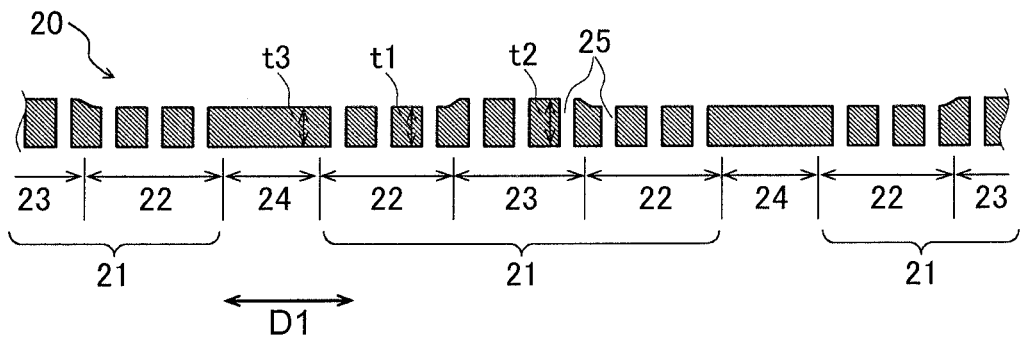
FIG. 6 is a sectional view of the deposition mask of FIG. 4 seen from the B-B direction.

FIG. 5 is a sectional view of the deposition mask 20 of FIG. 4 seen from the A-A direction, and FIG. 6 is a sectional view of the deposition mask 20 of FIG. 4 seen from the B-B direction. As shown in FIGS. 5 and 6, the central area 23 of the effective part 21 has a thickness t2 that is larger than a thickness t1 of the outer peripheral area 22. Thus, when the distribution density of the openings 25 in the outer peripheral area 22 and the distribution density of the openings 25 in the central area 23 are equal or similar to each other, the central area 23 has a larger inner stress as compared with the outer peripheral area 22.

Figure 7:
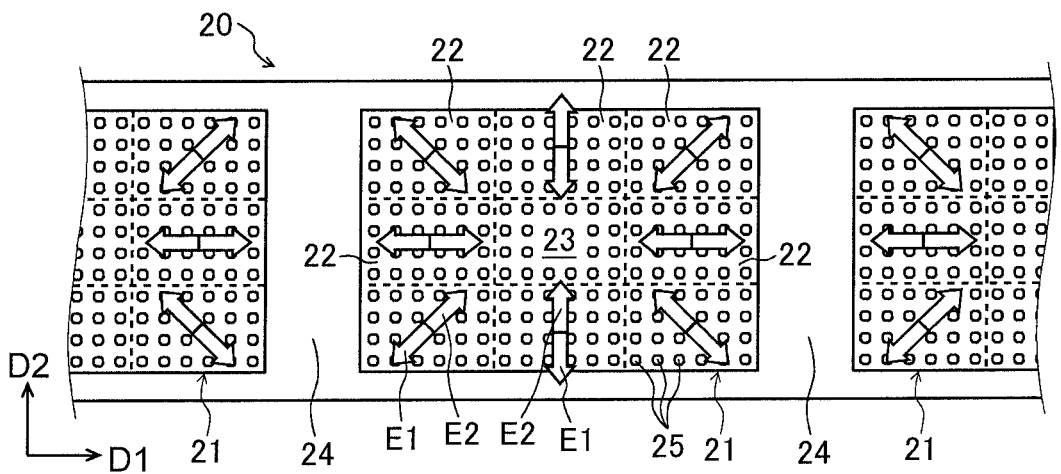
FIG. 7 is a plan view schematically showing a force applied to an outer peripheral area of an effective part of the deposition mask according to one embodiment of the present disclosure.

FIG. 7 is a plan view schematically showing a force applied to the outer peripheral area 22 of the effective part 21 of the deposition mask 20 according to this embodiment. As described above, the outer peripheral area 22 is subjected to the tensile forces E1 from the outer frame part 24. In addition, since the inner stress of the central area 23 is larger than the inner stress of the outer peripheral area 22, the outer peripheral area 22 is further subjected to a tensile force E2 from the central area 23. Since the tensile force E1 and the tensile force E2 act in directions opposed to each other against the outer peripheral area 22, the forces are at least partially counteracted each other. Thus, the tensile force applied to the outer peripheral are 22 can be reduced. As a result, deviation of positions of the openings 25 located in the outer peripheral area 22 from the design can be reduced.

The fact that "the central area 23 has a thickness larger than that of the outer peripheral area 22" means that at least any one of the below conditions (1), (2) and (3) is satisfied.
(1) Thicknesses t2, which are measured at a plurality of locations in the ninth area constituting the central area 23, are all larger than thicknesses t1, which are measured at a plurality of locations in each of the 8 areas constituting the outer peripheral area 22.
(2) An average value T2 of thicknesses t2, which are measured at a plurality of locations in the ninth area constituting the central area 23, is larger than an average value T1 of thicknesses t1, which are measured at a plurality of locations in each of the 8 areas constituting the outer peripheral area 22.
(3) An average value T2 of thicknesses t2, which are measured at a plurality of locations in the ninth area constituting the central area 23, is larger than average values T11, T12, T13, T14, T15, T16, T17 and T18 of thicknesses t1, which are measured at a plurality of locations in each of the 8 areas constituting the outer peripheral area 22.

Only one of the conditions (1), (2) and (3) may be satisfied, two conditions may be satisfied, or all the three conditions may be satisfied.

The number of thickness measurement locations in each of the 8 areas constituting the outer peripheral area 22 and the ninth area constituting the central area 23 is 5 or more and 36 or less, for example, 9.

When a standard deviation of the thicknesses t1, which are measured at a plurality of locations in each of the 8 areas constituting the outer peripheral area 22, is represented as $\sigma 1$, it is preferable that the following relational expressions are satisfied.

$$T1 < T2 \qquad (4)$$

$$3\sigma 1 < T2/2 \qquad (5)$$

By manufacturing the deposition mask 20 so as to satisfy the above conditions, the tensile force E2 toward the central area 23 can be reliably generated at each position in the outer peripheral area 22. Thus, deviation of positions of the openings 25 located in the outer peripheral area 22 from the design can be more reliably reduced.

A ratio (=T2/T1) of the average value T2 of the thicknesses t2 of the central area 23 relative to the average value T1 of the thicknesses t1 of the outer peripheral area 22 is preferably 1.000 or more, and more preferably 1.060 or more. In addition, T2/T1 is preferably 1.200 or less, and more preferably 1.170 or less.

In FIGS. 5 and 6, the symbol t3 depicts a thickness of the outer frame part 24. The thickness t3 of the outer frame part 24 is not specifically limited. However, preferably, the thickness t3 of the outer frame part 24 is equal or similar to the thickness t1 of the outer peripheral area 22 of the effective part 21. For example, a ratio (=T3/T1) of an average value T3 of the thicknesses t3 of the outer frame part 24 relative to the average value T1 of the thicknesses t1 of the outer peripheral area 22 is 0.920 or more and 1.080 or less.

Next, an example of adjustment in thickness of the central area 23 in accordance with the position of the effective part 21 is described. As shown in FIG. 3, when the plurality of effective areas 21 are arranged side by side along the first direction D1, the thickness of the central area 23 of the effective part 21 closest to the end of the deposition mask 20 in the first direction D1, may be larger than the thickness of the central area 23 of the effective part 21 closest to the center of the deposition mask 20 in the first direction D1. In other words, the thickness of the central area 23 of the effective part 21, which is close to the frame 15, may be larger than the thickness of the central area 23 of the effective part 21, which is distant from the frame 15. Thus, when supporting the deposition mask 20 in a taut state by the frame 15, an operability of an alignment step of the openings 25 in each effective part 21 can be improved.

Figure 8:
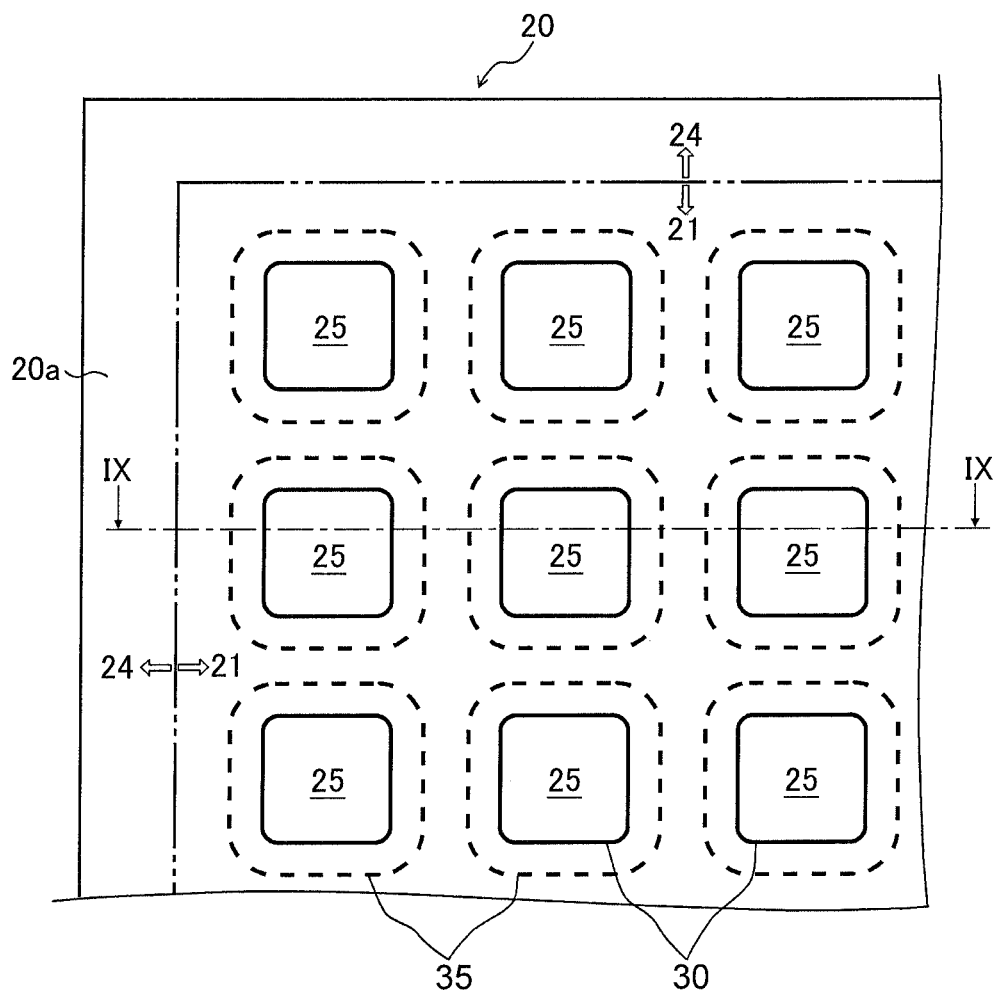
FIG. 8 is a plan view showing the effective part of the deposition mask in enlargement.
Figure 9:
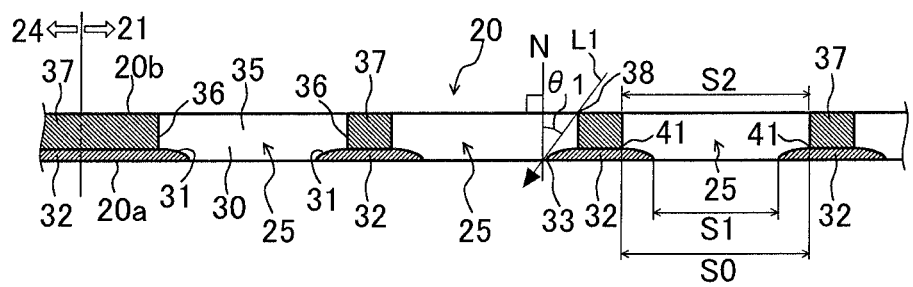
FIG. 9 is a sectional view of the deposition mask of FIG. 8 seen from the IX-IX direction.

Herebelow, the effective part 21 of the deposition mask 20 is described in detail. FIG. 8 is a plan view showing the effective part 21 in enlargement, and FIG. 9 is a sectional view of the effective part 21 of FIG. 8 seen from the IX-IX direction. As shown in FIG. 8, the plurality of openings 25 are regularly arranged in the effective part 21 along two directions orthogonal to each other at respective predetermined pitches.

Herebelow, shapes of the opening 25 and a circumferential portion thereof are described in detail. Herein, shapes of the opening 25 and a circumferential portion thereof, in a case where the deposition mask 20 is formed by a plating process, are described.

As shown in FIG. 9, a metal layer of the effective part 21 comprises a first metal layer 32 which constitutes the first surface 20a, and a second metal layer 37 which constitutes the second surface 20b. The first metal layer 32 is provided with first openings 30 in a predetermined pattern, and the second metal layer 37 is provided with second openings 35 in a predetermined pattern. In the effective part 21, the first opening 30 and the second opening 35 communicate with each other so as to form the opening 25 that extends from the first surface 20a to the second surface 20b of the deposition mask 20.

As shown in FIG. 8, the first opening 30 and the second opening 35 constituting the opening 25 may have a substantially polygonal shape in plan view. Herein, the first opening 30 and the second opening 35 have a substantially quadrangular shape, more specifically a substantially square shape, by way of example. Although not shown, the first opening 30 and the second opening 35 may have another polygonal shape, such as a substantially hexagonal shape or a substantially octagonal shape. Note that the "substantially polygonal shape" is a concept including a polygonal shape with rounded corners. In addition, although not shown, the first opening 30 and the second opening 35 may have a circular shape. In addition, it is not necessary that the shape of the first opening 30 and the shape of the second opening 35 are similar to each other.

In FIG. 9, the symbol 41 depicts a connection portion at which the first metal layer 32 and the second metal layer 37 are connected to each other. In addition, the symbol S0 depicts a dimension of the opening 25 at the connection portion 41 between the first metal layer 32 and the second metal layer 37. FIG. 9 shows the example in which the first metal layer 32 and the second metal layer 37 are in contact with each other. However, not limited thereto, another layer may be interposed between the first metal layer 32 and the second metal layer 37. For example, a catalyst layer for promoting precipitation of the second metal layer 37 on the first metal layer 32 may be provided between the first metal layer 32 and the second metal layer 37.

Figure 10:
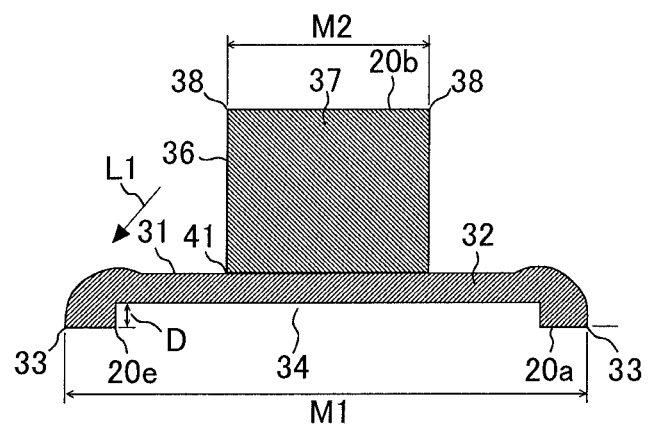
FIG. 10 is a sectional view showing a metal layer of the effective part of FIG. 9 in enlargement.

FIG. 10 is a view showing the first metal layer 32 and the second metal layer 37 of FIG. 9 in enlargement. As shown in FIG. 10, a width M2 of the second metal layer 37 in the second surface 20b of the deposition mask 20 is smaller than a width M1 of the first metal layer 32 of the first metal layer 32 in the first surface 20a of the deposition mask 20. In other words, an opening dimension S2 of the opening 25 (second opening 35) in the second surface 20b is larger than an opening dimension S1 of the opening 25 (first opening 30) in the first surface 20a. For example, as shown in FIG. 9, when seen along a normal direction of the first surface 20a of the deposition mask 20, a profile of the second opening 35 surrounds a profile of the first opening 30. Here below, an advantage obtained from such configurations of the first metal layer 32 and the second metal layer 37 is described.

The deposition material 98 coming from the second surface 20b side of the deposition mask 20 sequentially passes the second opening 35 and the first opening 30 of the opening 25 so as to adhere to the organic EL substrate 92. An area of the organic EL substrate 92, onto which the deposition material 98 adheres, is mainly determined depending on the opening dimension S1 and the opening shape of the opening 25 in the first surface 20a. As indicated by the arrow L1 extending from the second surface 20b toward the first surface 20a in FIGS. 9 and 10, the deposition material 98 not only moves from the crucible 94 toward the organic EL substrate 92 along a normal direction N of the deposition mask 20, but also sometimes moves along a direction largely inclined with respect to the normal direction N of the deposition mask 20. At this time, if the opening dimension S2 of the opening 25 in the second surface 20b is the same as the opening dimension S1 of the opening 25 in the first surface 20a, the diagonally moving deposition material 98 is likely to be caught in a wall surface 36 of the second metal layer 37 and a wall surface 31 of the first metal layer 32, whereby a ratio of the deposition material 98, which cannot pass through the opening 25, increases. Thus, in order to improve utilization efficiency of the deposition material 98, it is preferable that the opening dimension S2 of the second opening 35 is increased, i.e., the width M2 of the second metal layer 37 is decreased.

In FIG. 9, a minimum angle defined by a straight line L1 with respect to the normal direction N of the deposition mask 20, is represented by the symbol θ1. The straight line L1 is tangent to the wall surface 36 of the second metal layer 37 and the wall surface 31 of the first metal layer 32. In order that the diagonally moving deposition material 98 is allowed to reach the organic EL substrate 92 as much as possible, it is advantageous to increase the angle θ1. For example, the angle θ1 is preferably 45° or more. In order to increase the angle θ1, it is effective that the width M2 of the second metal layer 37 is made smaller than the width M1 of the first metal layer 32. The aforementioned opening dimensions S0, S1 and S2 are appropriately determined in consideration of a pixel density of the organic EL display device and a desired value of the above angle θ1.

As shown in FIG. 10, a recess 34 may be formed in the first surface 20a of the deposition mask 20, which is constituted by the first metal layer 32. When the deposition mask 20 is manufactured by a plating process, the recess 34 is formed correspondingly to an electrically conductive pattern 52 of a pattern substrate 50 described below. A depth D of the recess 34 is, for example, 50 nm or more and 500 nm or less. Preferably, an outer periphery 34e of the recess 34 formed in the first metal layer 32 is positioned between an end 33 of the first metal layer 32 and the connection portion 41.

Next, compositions of the first metal layer 32 and the second metal layer 37 are described. In this embodiment, preferably, the composition of the first metal layer 32 and the composition of the second metal layer 37 are the same with each other. The expression "same composition" means that a difference between content rate of iron and nickel by mass in the first metal layer 32 and content rate of iron and nickel by mass in the second metal layer 37 is 2% or less by mass, which is calculated by an energy dispersive x-ray analysis (referred to also as EDX analysis here below) described below. Preferably, as to another element such as nickel or chrome contained in the first metal layer 32 and the second metal layer 37, a difference, which is between a % by mass of the contained in the first metal layer 32 and a % by mass of the element contained in the second metal layer 37, is also 2% or less by mass.

Since the composition of the first metal layer 32 and the composition of the second metal layer 37 are the same with each other, a difference between a thermal expansion coefficient of the first metal layer 32 and a thermal expansion coefficient of the second metal layer 37 can be reduced. Thus, it can be suppressed that a stress and/or a strain in an interface between the first metal layer 32 and the second metal layer 37 is caused by temperature change. As a result, the first metal layer 32 and the second metal layer 37 can be suppressed from being warped and/or bent because of temperature change.

Preferably, the deposition mask 20 does not have, at least in the effective part 21, a constituent element other than the first metal layer 32 and the second metal layer 37. For example, the first surface 20a of the deposition mask 20 is constituted by the first metal layer 32, and the second surface 20b of the deposition mask 20 is constituted by the second metal layer 37. Thus, the deposition mask 20 can be suppressed from being warped and/or bent upon temperature change because different materials are used.

Here below, a method of analyzing compositions of the first metal layer 32 and the second metal layer 37 by the EDX analysis is described.

Figure 25:
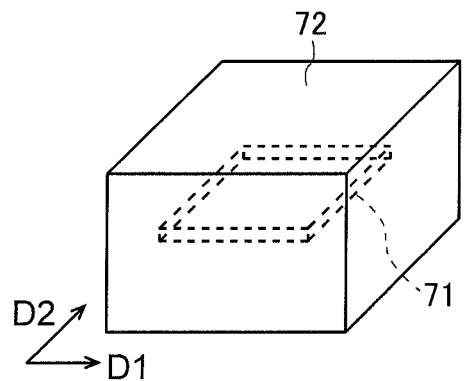
FIG. 25 is a view showing a state in which a specimen to be used in composition analysis is encapsulated with a resin.

A specimen 71 including the effective part 21 of the deposition mask 20 is cut out from the deposition mask 20. Following thereto, as shown in FIG. 25, the specimen 71 is encapsulated with a resin 72. An epoxy resin is used as the resin 72, for example. A thickness of the specimen 71 to be encapsulated is equal or similar to the thickness of the effective part 21 of the deposition mask 20. Dimensions of the specimen 71 in the plane directions D1 and D2 of the deposition mask 20 are respectively 5 mm, for example.

Then, a trimming process is performed such that a cross-section of the specimen 71 is exposed from the resin 72. Then, a finishing process using an ion beam is performed to the specimen 71 and the resin 72. In this way, as shown in FIG. 26, a measurement sample 70 having a measurement surface 73, in which cross-sections of the first metal layer 32 and the second metal layer 37 to be measured of the deposition mask 20 are exposed from the resin 72, can be obtained.

Figure 26:
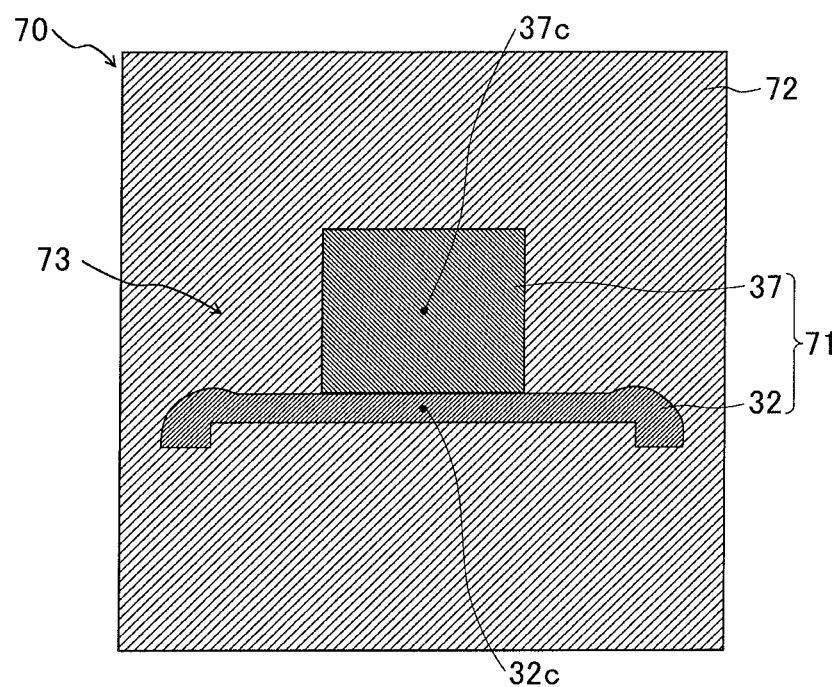
FIG. 26 is a view showing a measurement surface of a measurement sample obtained by cutting the specimen encapsulated with the resin.

In FIG. 26, the symbol 32c depicts a measurement location of the cross-section of the first metal layer 32 in the measurement surface 73, which is measured by the EDX analysis. The symbol 37c depicts a measurement location of the cross-section of the second metal layer 37 in the measurement surface 73, which is measured by the EDX analysis. For example, the measurement location 32c of the first metal layer 32 is positioned at a center of the first metal layer 32 in the plane direction of the deposition mask 20. Similarly, for example, the measurement location of the second metal layer 37 is positioned at a center of the second metal layer 37 in the plane direction of the deposition mask 20.

In the aforementioned trimming process and the finishing process, the specimen 71 and the resin 72 are cut by the trimming process such that a distance up to the measurement surface 73 is 30 μm. Thereafter, the specimen 71 and the resin 72 are subjected to the finishing process using an ion beam, so as to remove damage caused by the trimming process. Thus, the measurement sample 70 having the measurement surface 73 shown in FIG. 26 can be obtained. As an apparatus for performing the trimming process, an ultra-microtome manufactured by Leica Microsystems. com can be used.

As an apparatus for performing the aforementioned finishing process, an apparatus that etches the specimen 71 and the rein 72 by application of an ion beam can be used. For example, a cross section polisher manufactured by JEOL Ltd. can be used. In the finishing process, a shielding plate is placed on the trimmed specimen 71 and the resin 72. Thereafter, an ion beam is applied to the trimmed specimen 71, the resin 72 and the shielding plate, with the trimmed specimen 71 and the resin 72 being projecting from the shielding plate by 30 μm. Settings of the cross section polisher manufactured by JEOL Ltd. are as follows.

Voltage: 5 kV
Time: 6 hours

Following thereto, the measurement surface 73 of the obtained measurement sample 70 is observed by using a scanning electron microscope. Thus, the measurement location 32c of the first metal layer 32 and the measurement location 37c of the second metal layer 37 can be specified.

As the scanning electron microscope, Ultra 55 manufactured by Carl ZEISS AG can be used, for example. Settings of the scanning electron microscope at this time are as follows.

Voltage: 15 kV
Working Distance: 8.5 mm
Observation Magnification: 5000 times
Observation Magnification Standard: Polaroid 545

After observation of the measurement surface 73, an EDX analysis apparatus is calibrated by using a standard specimen. Then, the compositions of the measurement location 32c of the first metal layer 32 and the measurement location 37c of the second metal layer 37 are analyzed by the EDX analysis apparatus. As the EDX analysis apparatus, Quantax QX400 manufactured by BRUKER company can be used, for example.

An accuracy of quantitative analysis of compositions of the first metal layer 32 and the second metal layer 37, when Quantax QX400 manufactured by BRUKER company is used, is ±2% by mass. Thus, among elements detected by the quantitative analysis of the compositions of the first metal layer 32 and the second metal layer 37, an element whose content rate is 2% or less by mass may be neglected in the judgment of whether the composition of the first metal layer 32 and the composition of the second metal layer 37 are the same or not.

When the thicknesses of the first metal layer 32 and the second metal layer 37 are small, e.g., when the thicknesses are 1 μm or less, there is a possibility that the composition analysis result is affected by electron beam scattering caused by the surrounding resin 72. In the quantitative analysis of the compositions of the first metal layer 32 and the second metal layer 37, it is preferable that such an influence of the resin 72 is eliminated. Whether the composition analysis result is affected by the surrounding resin 72 or not is judged based on the fact that a detection amount of a component, which is considered to be caused by the surrounding resin 72 in the composition quantitative analysis result, changes or not, when an acceleration voltage of the scanning electron microscope is changed.

(Method of Manufacturing Deposition Mask)

Next, a method of manufacturing the deposition mask 20 is described. FIGS. 11 to 14 are views describing the method of manufacturing the deposition mask 20.

<Pattern Substrate Preparation Step>

Figure 11:
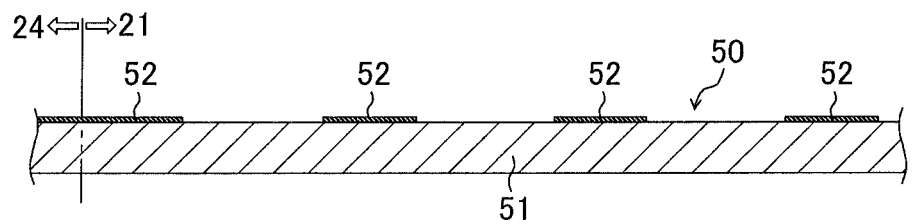
FIG. 11 is a view describing an example of a method of manufacturing the deposition mask.

Firstly, a pattern substrate 50 shown in FIG. 11 is prepared. The pattern substrate 50 has a base member 51 with insulation properties, and an electrically conductive pattern 52 formed on the base member 51. The electrically conductive pattern 52 has a pattern corresponding to the first metal layer 32.

A material of the base member 51 and a thickness of the base member 51 are not specifically limited as long as the base member 51 has insulation properties and suitable strength. For example, glass or synthetic resin may be used for a material of the base member 51.

As a material of the electrically conductive pattern 52, a material having an electrical conductivity, such as a metal material or an oxide conductive material, may be suitably used. For example, a metal material may be chrome or copper. A thickness of the electrically conductive pattern 52 is 50 nm or more and 500 nm or less, for example.

In order to facilitate a separation step, which will be described below, for separating the deposition mask 20 from the pattern substrate 50, the pattern substrate 50 may be subjected to a mold release process.

For example, a defatting process for removing fat from a surface of the pattern substrate 50 is performed. For example, with the use of an acid defatting liquid, fat on the surface of the pattern substrate 50 is removed.

Then, an activation process for activating the surface of the electrically conductive pattern 52 is performed. For example, acid solution, which is the same as an acid solution contained in a first plating solution used in a below-described first plating process, is brought into contact with the surface of the electrically conductive pattern 52. For example, when the first plating solution contains nickel sulfamate, sulfamate is brought into contact with the surface of the electrically conductive pattern 52.

Then, an organic-film formation process for forming an organic film on the surface of the electrically conductive pattern 52 is performed. For example, a mold release agent containing an organic substance is brought into contact with the surface of the electrically conductive pattern 52. At this time, a thickness of the organic film is determined to be so thin that precipitation of the first metal layer 32 by electrolytic plating is not inhibited by an electric resistance of the organic film. The mold release agent may contain a sulfur component.

A water washing process for washing the pattern substrate 50 with water is performed respectively after the defatting process, the activation process and the organic-film formation process.

<First Plating Process>

Then, a first plating process for supplying a first plating solution to the base member 51 on which the electrically conductive pattern 52 is formed, so as to precipitate the first metal layer 32 on the electrically conductive pattern 52 is performed. For example, the base member 51 on which the electrically conductive pattern 52 is formed is immersed into a plating bath filled with the first plating solution. Thus, as shown in FIG. 12, the first metal layer 32 in which the first openings 30 are provided in a predetermined pattern can be obtained on the pattern substrate 50.

Figure 12:
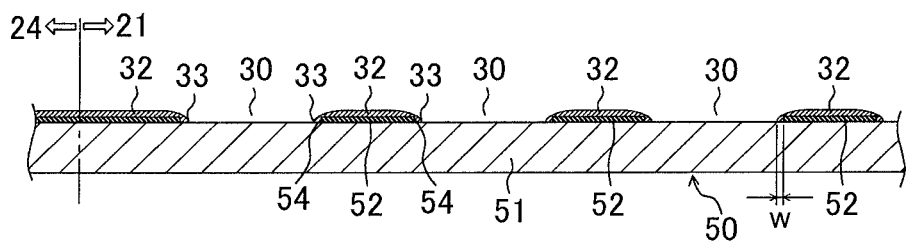
FIG. 12 is a view describing the example of the method of manufacturing the deposition mask.

Because of the properties of the plating process, as shown in FIG. 12, when seen along the normal direction of the base member 51, the first metal layer 32 is formed not only at a portion that is overlapped with the electrically conductive pattern 52 but also at a portion that is not overlapped with the electrically conductive pattern 52. This is because the first metal layer 32 is further precipitated on a surface of the first metal layer 32 which is precipitated on a portion that is overlapped with an end 54 of the electrically conductive pattern 52. As a result, as shown in FIG. 12, when seen along the normal direction of the base member 51, the end 33 of the first opening 30 may be positioned on a portion that is not overlapped with the electrically conductive pattern 52. In addition, the aforementioned recess 34 corresponding to the thickness of the electrically conductive pattern 52 is formed on a surface of the first metal layer 32, which is in contact with the electrically conductive pattern 52.

In FIG. 12, a width of a portion of the first metal layer 32, which is not overlapped with the electrically conductive pattern 52, i.e., a width of a portion on which the recess 34 is not formed, is depicted by the symbol w. The width w is 0.5 μm or more and 5.0 μm or less, for example. The dimension of the electrically conductive pattern 52 is determined in consideration of the width w.

A specific method of the first plating process is not specifically limited, as long as the first metal layer 32 can be precipitated on the electrically conductive pattern 52. For example, the first plating process may be performed as a so-called electrolytic plating process that applies an electric current through the electrically conductive pattern 52, so as to precipitate the first metal layer 32 on the electrically conductive pattern 52. Alternatively, the first plating process may be an electroless plating process. When the first plating process is an electroless plating process, a suitable catalyst layer may be provided on the electrically conductive layer 52. Alternatively, the electrically conductive pattern 52 may serve as a catalyst layer. When an electrolytic plating process is performed, a catalyst layer may be provided on the electrically conductive pattern 52.

Components of the first plating solution to be used are determined such that the first metal layer 32 contains nickel of 38% or more by mass and 62% or less by mass, balancing iron, and inevitable impurities. For example, as the first plating solution, a mixed solution of a solution containing nickel compound and a solution containing iron compound can be used. For example, a mixed solution of a solution containing nickel sulfamate or nickel bromide and a solution containing ferrous sulfamate can be used. The plating solution may contain various additive agents. As the additive agents, a PH buffer such as boric acid, a primary luster such as sodium saccharin, a secondary luster such as butynediol, propargylic alcohol, coumarin, formalin, thiourea, and an antioxidizing agent may be used. The primary luster may contain sulfur component.

<Resist Formation Process>

Figure 13:
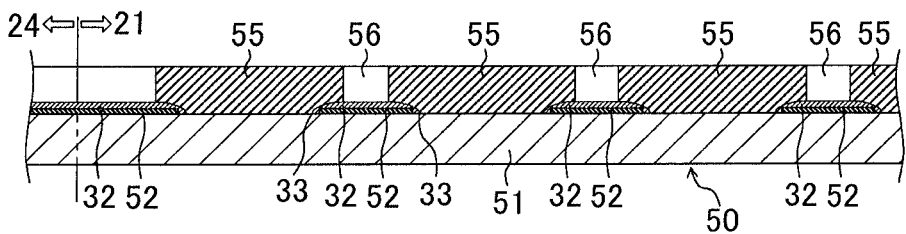
FIG. 13 is a view describing the example of the method of manufacturing the deposition mask.

Then, a resist formation step of forming a resist pattern 55 on the base member 51 and the first metal layer 32 is performed. Gaps are formed in the resist pattern 55. FIG. 13 is sectional view showing the resist pattern 55 formed on the base member 51. As shown in FIG. 13, the resist formation step is performed such that the first opening 30 of the first metal layer 32 is covered with the resist pattern 55, and that the Gaps 56 in the resist pattern 55 is positioned above the first metal layer 32.

Here below, an example of the resist formation process is described. Firstly, by attaching a dry film on the base substrate 51 and the first metal layer 32, a negative-type resist film is formed. The dry film is a film that is attached to an object such as the base member 51, in order to form a resist film on the object. The dry film at least includes a base film made of PET or the like, and a photosensitive layer with a photosensitivity, which is stacked on the base film. The photosensitive layer contains a photosensitive material such as an acryl-based photo-curable resin, an epoxy-based resin, a polyimide-based resin, a styrene-based resin or the like. A resist film may be formed by applying a material for the resist pattern 55, and then by performing calcination according to need.

Then, an exposure mask that blocks transmission of light to an area of the resist film is prepared. The area is to become the gaps 56. Then the exposure mask is placed on the resist film. After that, the exposure mask is sufficiently brought into tight contact with the resist film by vacuum contact. Thereafter, the resist film is exposed to light through the exposure mask. Further, the resist film is developed for forming an image on the exposed resist film. In this way, as shown in FIG. 13, the resist pattern 55 which has the gaps 56 positioned above the first metal layer 32 and which covers the first opening 30 of the first metal layer 32 can be formed. In order that the resist pattern 55 is more solidly brought into contact with the base member 51 and the first metal layer 32, a heating process for heating the resist pattern 55 may be performed after the developing process.

A positive-type resist film may also be used. In this case, as an exposure mask, an exposure mask that allows transmission of light to an area of the resist film, which is to be removed, is used.

<Second Plating Process>

Figure 14:
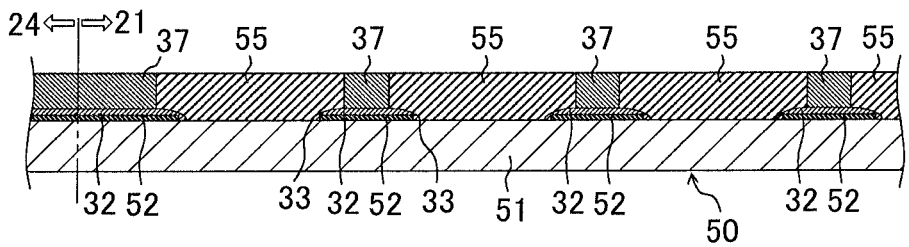
FIG. 14 is a view describing the example of the method of manufacturing the deposition mask.

Next, a second plating process of supplying a second plating solution to the gaps 56 in the resist pattern 55, so as to precipitate the second metal layer 37 on the first metal layer 32 is performed. For example, the base member 51 on which the first metal layer 32 is formed is immersed into a plating bath filled with a second plating solution. Thus, as shown in FIG. 14, the second metal layer 37 can be formed on the first metal layer 32. The second plating process is performed as a so-called electrolytic plating process that applies an electric current through the first metal layer 32 so as to precipitate the second metal layer 37 on the first metal layer 32. Alternatively, the second plating process may be an electroless plating process.

In this embodiment, the second plating process is performed such that a thickness of the second metal layer 37, which constitutes the central area 23 of the effective part 21, is larger than a thickness of the second metal layer 37, which constitutes the outer peripheral area 22 of the effective part 21. Here below, an example of the second plating process enabling such a thickness control is described with reference to FIGS. 15 to 17.

Figure 15:
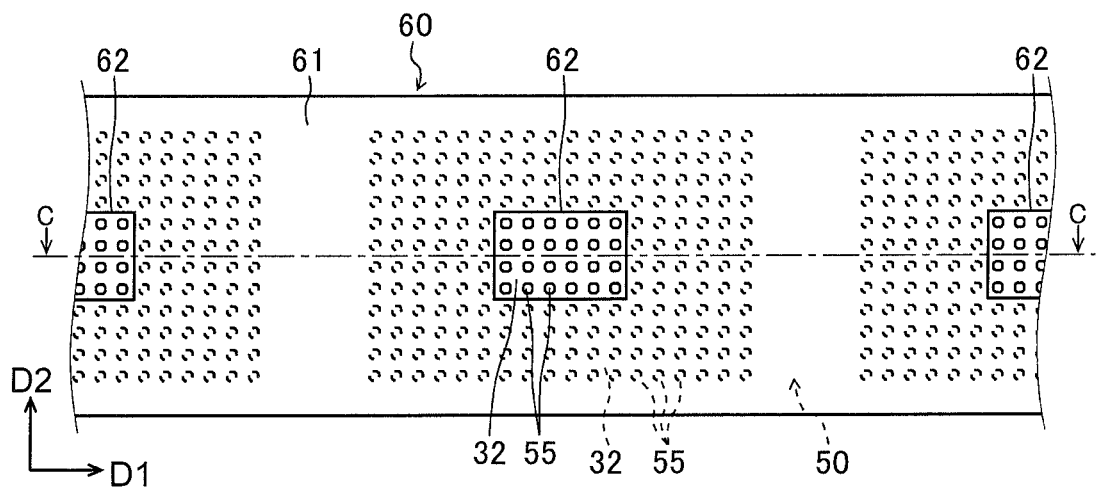
FIG. 15 is a view describing an example of a plating process.
Figure 16:
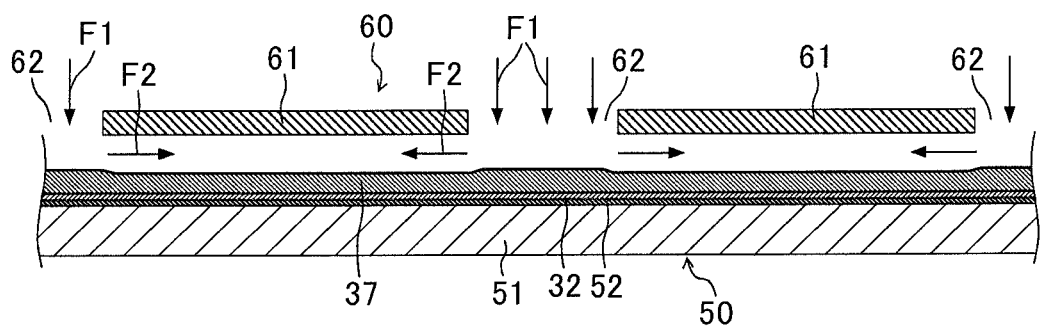
FIG. 16 is a view describing the example of the plating process.

FIG. 15 is a plan view showing a shielding plate 60 used for forming the second metal layer 37 of the outer peripheral area 22 and the central area 23 of the effective part 21 shown in FIG. 7 by a plating process. In addition, FIG. 16 is a sectional view of the shielding plate 60 shown in FIG. 15 seen from the C-C direction. The shielding plate 60 has a shielding part 61, and a through-part 62 surrounded by the shielding part 61. When seen along the normal direction of the base member 51 of the pattern substrate 50, the through-part 62 is disposed so as to be at least partially overlapped with the first metal layer 32 that constitutes the central area 23 of the effective part 21. In addition, when seen along the normal direction of the base member 51 of the pattern substrate 50, the shielding part 61 is disposed so as to be at least partially overlapped with the first metal layer 32 that constitutes the outer peripheral area 22 of the effective part 21 and the outer frame part 24.

In the second plating process, as shown by the arrow F1 in FIG. 16, the second plating solution is supplied to the first metal layer 32 through the through-part 62 of the shielding plate 60. In this case, as shown by the arrow F2 in FIG. 16, the second plating solution, which has flown on the first metal layer 32 overlapped with the through-part 62, is supplied to the portion of the first metal layer 32, which is overlapped with the shielding part 61. Thus, in the portion of the first metal layer 32, which is overlapped with the shielding part 61, growth of the second metal layer 37 is restrained as compared with the portion of the first metal layer 32, which is overlapped with the through-part 62. In addition, when the shielding part 61 has an electrical conductivity, an electric field generated between the first metal layer 32 and a not-shown anode is shielded by the shielding part 61. Also for this reason, in the portion of the first metal layer 32, which is overlapped with the shielding part 61, the growth of the second metal layer 37 is restrained as compared with the portion of the first metal layer 32, which is overlapped with the through-part 62.

Figure 17:
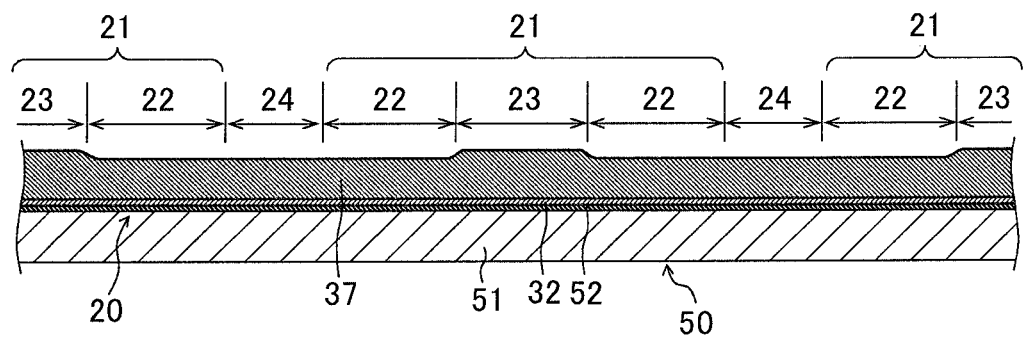
FIG. 17 is a view describing the example of the plating process.

By using the shielding plate 60 having the shielding part 61 and the through-part 62, the second metal layer 37 can be grown preferentially on the portion of the first metal layer 32, which is overlapped with the shielding part 61, i.e., on the first metal layer 32 that constitutes the central area 23. Thus, as shown in FIG. 17, the thickness of the second metal layer 37, which constitutes the central area 23, can be made larger that the thickness of the second metal layer 37, which constitutes the outer peripheral area 22 and the outer frame part 24. As a result, the thickness of the central area 23 can be made larger than the thickness of the outer peripheral area 22, whereby a tensile force toward the central area 23 can be generated in the outer peripheral area 22. The thickness of the central area 23 and the thickness of the outer peripheral area 22 are each measured at a most thick location, i.e., a location at which the first metal layer 32 and the second metal layer 37 are overlapped with each other.

Components of the second plating solution to be used are determined such that the second metal layer 37 contains nickel of 38% or more by mass and 62% or less by mass, balancing iron, and inevitable impurities. For example, the same plating solution as the aforementioned first plating solution may be used as the second plating solution. Alternatively, a plating solution different from the first plating solution may be used as the second plating solution. When the composition of the first plating solution and the composition of the second plating solution are the same with each other, the composition of the metal constituting the first metal layer 32 and the composition of the metal constituting the second metal layer 37 are also the same with each other.

FIG. 14 shows the example in which the second plating process is continued until the upper surface of the resist pattern 55 and the upper surface of the second metal layer 37 become flush with each other. However, not limited thereto, the second plating process may be stopped in a state where the upper surface of the second metal layer 37 is located below the upper surface of the resist pattern 55.

Although not shown, during the first plating process, the first plating solution may be supplied to the base member 51 through the through-part 62 of the shielding plate 60. Thus, similarly to the aforementioned second plating process, the first metal layer 32 can be grown preferentially on a portion of the base member 51, which corresponds to the central area 23.

<Removal Process>

Thereafter, a removal process for removing the resist pattern 55 is performed. For example, the resist pattern 55 can be stripped from the base member 51, the first metal layer 32 and the second metal layer 37 by using an alkaline-based stripper.

<Separation Process>

Next, a separation process for separating a combined body of the first metal layer 32 and the second metal layer 37 from the base member 51 is performed. Thus, the deposition mask 20, which comprises the first metal layer 32 in which the first openings 30 are provided in a predetermined pattern, and the second metal layer 37 in which the second openings 35 in communication with the first openings 30 are provided, can be obtained.

Herebelow, an example of the separation step is described in detail. Firstly, a film which is, for example, coated with an adhesive material is attached to the combined body of the first metal layer 32 and the second metal layer 37, which is formed on the base member 51. Then, by drawing or winding the film, the film is pulled away from the base member 51 so that the combined body of the first metal layer 32 and the second metal layer 37 is separated from the base member 51 of the pattern substrate 50. Thereafter, the film is peeled from the combined body of the first metal layer 32 and the second metal layer 37.

In addition thereto, in the separation process, a gap for triggering separation may be formed between the combined body of the first metal layer 32 and the second metal layer 37 and the base member 51, and then air may be blown to the gap so as to promote the separation process.

As the adhesive material, a substance which loses its adhesion when irradiated with light such as UV or heated may be used. In this case, after the combined body of the first metal layer 32 and the second metal layer 37 has been separated from the base member 51, a step of irradiating the film with light or a step of heating the film is performed. Thus, a step of peeling the film from the combined body of the first metal layer 32 and the second metal layer 37 can be facilitated. For example, the film can be peeled in a state where the film and the combined body of the first metal layer 32 and the second metal layer 37 are maintained parallel to each other as much as possible. Thus, upon peeling of the film, the combined body of the first metal layer 32 and the second metal layer 37 can be suppressed from being curved, whereby the deposition mask 20 can be suppressed from being prone to be deformed such as curved.

The deposition mask 20 manufactured by a plating process has an inner stress caused by plating. As a method for alleviating such an inner stress, it can be considered that the deposition mask 20 is annealed. On the other hand, when the deposition mask 20 is subjected to an annealing process before it is separated from the pattern substrate 50, there is a possibility that the base member 51 is bent or cracked to damage the deposition mask 20, because of a difference between a linear expansion coefficient of the deposition mask 20 and a linear expansion coefficient of the base member 51 of the pattern substrate 50. In consideration of this risk, in this embodiment, after the deposition mask 20 has been manufactured on the pattern substrate 50 by a plating process, the deposition mask 20 may be separated from the pattern substrate 50, without annealing the deposition mask 20. For example, after the plating process has performed and before the separation step is performed, a step of heating the metal layers of the deposition mask at 140° C. or more is not performed. Thus, it can be suppressed that the deposition mask 20 is damaged because of bending and/or cracking of the pattern substrate 50. It goes without saying that a step of annealing the deposition mask 20 can be performed depending on situations.

(Welding Process of Deposition Mask)

Next, a welding process for welding the thus obtained deposition mask 20 to the frame 15 is performed. Thus, the deposition mask apparatus 10, which comprises the deposition masks 20 and the frame 15, can be obtained.

In this embodiment, since the thickness of the central area 23 of the effective part 21 is larger than the thickness of the outer peripheral area 22, a tensile force toward the central area 23 can be generated in the outer peripheral area 22. Thus, a tensile force applied from the outer frame part 24 and a tensile force applied from the central area 23 can be at least partially counteracted to each other. As a result, deviation of positions of the openings 25 located in the outer peripheral area 22 from the design can be reduced.

(Deposition Method)

Next, a deposition method for depositing the deposition material 98 onto a substrate such as the organic EL substrate 92, with the use of the deposition mask apparatus 10 comprising the deposition masks 20 and the frame 15, is described. Firstly, the deposition mask apparatus 10 is disposed such that the deposition mask 20 is opposed to the organic EL substrate 92. In addition, the deposition mask 20 is brought into tight contact with the organic EL substrate 92 by means of the magnet 93. Under this state, by evaporating the deposition material 98 to fly to the organic EL substrate 92 through the deposition mask 20, the deposition material 98 can be deposited onto the organic EL substrate 92 in a pattern corresponding to the openings 25 of the deposition mask 20. In this embodiment, as described above, deviation of positions of the openings 25 located in the outer peripheral area 22 from the design can be reduced. Thus, the deposition material 98 can be deposited onto the organic EL substrate 92 with increased positional precision.

The aforementioned embodiment can be variously modified. Here below, modification examples are described with reference to the drawings when needed. In the below description and the drawings used in the below description, a part that can be similarly constituted to the above embodiment has the same symbol as that of corresponding part the above embodiment, and overlapped description is omitted. In addition, when the effect obtained by the aforementioned embodiment is apparently obtained in the modification examples, description thereof is possibly omitted.

(Modification Example of Plating Process)

Figure 18:
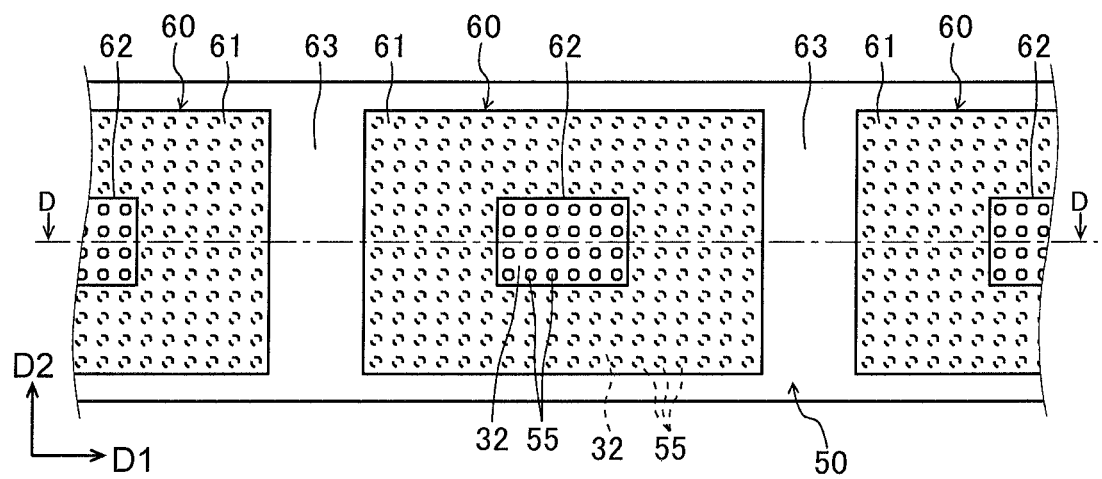
FIG. 18 is a view describing another example of the plating process.
Figure 19:
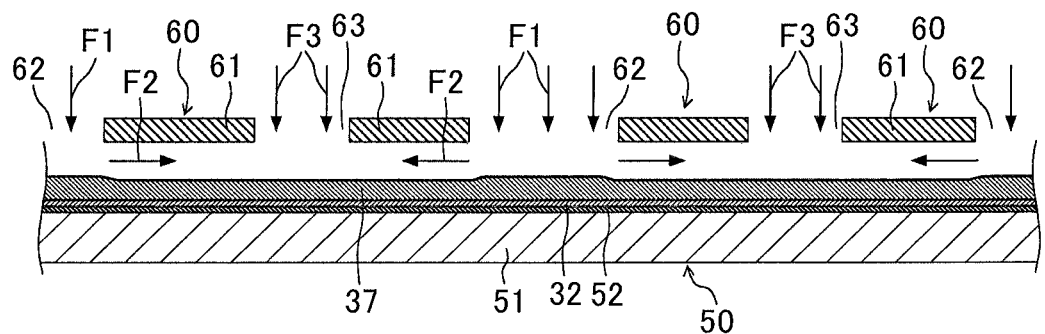
FIG. 19 is a view describing the other example of the plating process.

In the aforementioned embodiment, the shielding part 61 is overlapped with portions of the pattern substrate 50, which correspond to the outer peripheral area 22 of the effective part 21 and the outer frame part 24. However, it is sufficient that the shielding part 61 is overlapped at least with the portion of the pattern substrate 50, which corresponds to the outer peripheral area 22 of the effective part 21. The shielding part 61 may not be overlapped with the portion corresponding to the outer frame part 24. For example, as shown in FIGS. 18 and 19, in the plating process, a plurality of shielding plates 60 each having the shielding part 61 which is overlapped with a portion of the pattern substrate 50, which corresponds to the outer peripheral area 22 of the effective part 21, and the through-part 62 which is overlapped with a portion of the pattern substrate 50, which corresponds to the central area 23 of the effective part 21. In this case, a clearance 63 between the shielding plates 60 may be overlapped with a portion of the pattern substrate 50, which corresponds to the outer frame part 24. Alternatively, although not shown, the shielding plate 60 may have an opening overlapped with a portion of the pattern substrate 50, which corresponds to the outer frame part 24.

In this modification example, as shown by the arrow F3 in FIG. 19, a plating solution is also supplied to a portion of the pattern substrate 50, which corresponds to the outer frame part 24. No resist pattern 55 is formed on a portion of the pattern substrate 50, which corresponds to the outer frame part 24. On the other hand, as described above, the resist pattern 55 is formed on a portion of the pattern substrate 50, which corresponds to the effective part 21. Since an electric current does not flow through the portion of the pattern substrate 50, which is overlapped with the resist pattern 55, an electric current is likely to concentrate on the portion corresponding to the effective part 21, which is not overlapped with the resist pattern 55. Thus, a plating layer is likely to grow in the thickness direction on the portion of the pattern substrate 50, which corresponds to the effective part 21, as compared with the portion of the pattern substrate 50, which corresponds to the outer frame part 24. In other words, the plating layer is hard to grow in the thickness direction on the portion of the pattern substrate 50, which corresponds to the outer frame part 24, as compared with the portion of the pattern substrate 50, which corresponds to the effective part 21, where the resist pattern 55 is formed. Thus, even when the shielding part 61 is not placed on the portion of the pattern substrate 50, which corresponds to the outer frame part 24, it can be suppressed that a difference between the thickness of the outer frame part 24 and the thickness of the outer peripheral area 22 of the effective part 21 increases.

(Modification Example of Method of Manufacturing Deposition Mask)

In the aforementioned embodiment, the example in which the deposition mask 20 is constituted by stacking at least two metal layers, i.e., the first metal layer 32 and the second metal layer 37 was described. However, not limited thereto, the deposition mask 20 may be constituted by one metal layer 27 in which a plurality of openings 25 are formed in a predetermined pattern. Here below, an example in which the deposition mask 20 comprises one metal layer 27 is described with reference to FIGS. 20 to 22. In this modification example, a portion of the opening 25 extending from the first surface 20a to the second surface 20b of the deposition mask 20, which is positioned on the first surface 20a, is referred to as a first opening 30, and a portion of the opening 25, which is positioned on the second surface 20b, is referred to as a second opening 35.

A method of manufacturing the deposition mask 20 according to this modification example is described.

Figure 20:
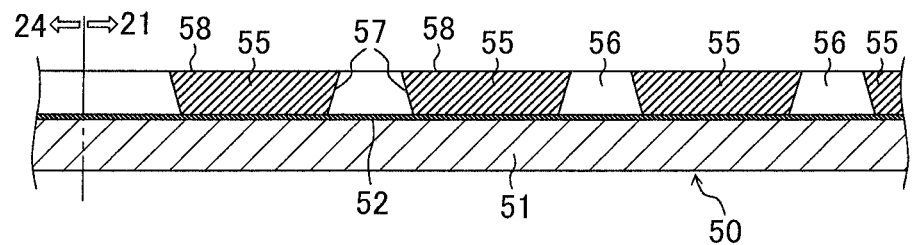
FIG. 20 is a view describing a modification example of a manufacturing method of the deposition mask.

Firstly, a base member 51 on which a predetermined electrically conductive pattern 52 is formed is prepared. Then, as shown in FIG. 20, a resist formation step for forming a resist pattern 55 having predetermined gaps 56 on the base member 51 is performed. Preferably, an interval between side surfaces 57 of the resist pattern 55 defining the gaps 56 in the resist pattern 55 narrows as it goes away from the base member 51. In other words, the resist pattern 55 has a shape in which a width of the resist pattern 55 widens as it goes away from the base member 51, i.e., an inverted tapered shape.

An example of a method for forming such a resist pattern 55 is described. For example, firstly, a resist film containing a photo-curable resin is provided on a surface of the base member 51, on which the electrically conductive pattern 52 is formed. Then, exposure light, which is incident on the base member 51 from a surface of the base member 51 opposed to another surface on which the resist film is provided, is applied to the resist film so that the resist film is exposed to the light. Thereafter, the resist film is developed. In this case, based on the diffraction of the exposure light, the resist pattern 55 having an inverted tapered shape shown in FIG. 20 can be obtained.

Figure 21:
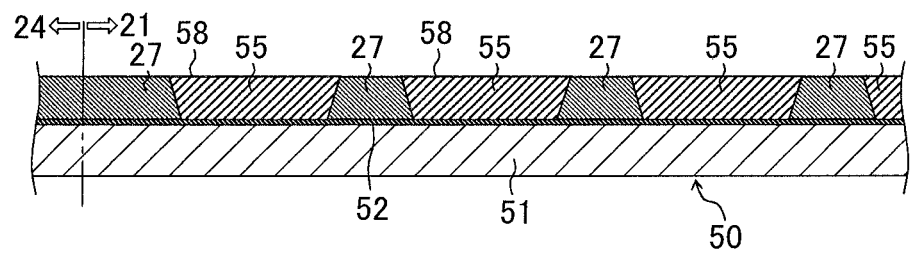
FIG. 21 is a view describing the modification example of the manufacturing method of the deposition mask.
Figure 22:
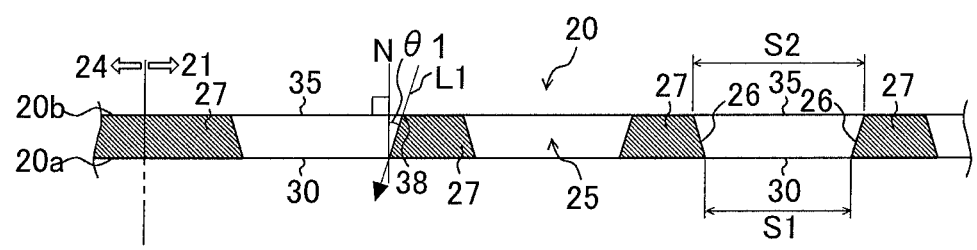
FIG. 22 is a sectional view showing a modification example of the deposition mask.

Then, as shown in FIG. 21, a plating process for supplying a plating solution to the gaps 56 in the resist pattern 55 is performed so as to precipitate the metal layer 27 on the electrically conductive pattern 52. Thereafter, by performing the aforementioned removal process and the separation process, as shown in FIG. 22, the deposition mask 20, which comprises the metal layer 27 provided with the openings 25 in a predetermined pattern, can be obtained. As shown in FIG. 22, a dimension of the opening 25 of the metal layer 27 in the plane direction of the first surface 20a decreases as it goes from the second surface 20b toward the first surface 20a.

Also in this modification example, similarly to the aforementioned embodiment, a plating process is performed with the use of a shielding plate 60 comprising a shielding part 61 overlapped with a portion of the pattern substrate 50, which corresponds to the outer peripheral area 22 of the effective part 21, and a through-part 62 overlapped with a portion of the pattern substrate 50, which corresponds to the central area 23 of the effective part 21. Thus, the thickness of the central area 23 of the effective part 21 can be made larger than the thickness of the outer peripheral area 22. As a result, deviation of positions of the openings 25 located in the outer peripheral area 22 from the design can be reduced.

The deposition mask 20 of this modification example preferably does not have, at least in the effective part 21, a constituent element other than the metal layer 27. For example, the first surface 20a and the second surface 20b of the deposition mask 20 are both constituted by the metal layer 27. Thus, the deposition mask 20 can be suppressed from being warped and/or bent upon temperature change because different materials are used.

Some modification examples of the aforementioned embodiment have been described. It goes without saying that the plurality of modification examples can be suitably combined and applied.

EXAMPLES

Next, examples of the embodiment of the present disclosure are described more specifically. Note that the embodiment of the present disclosure is not limited to the below examples, as long as it does not depart from a scope thereof.

Example 1

A deposition mask 20 having a first metal layer 32 and a second metal layer 37 shown in FIG. 9 was manufactured by a plating process. In the plating process, a plating solution was supplied with the use of a shielding plate 60 comprising a shielding part 61 overlapped with a portion of the pattern substrate 50, which corresponds to the outer peripheral area 22 of the effective part 21, and a through-part 62 overlapped with a portion of the pattern substrate 50, which corresponds to the central area 23 of the effective part 21.

An overall dimension of the deposition mask 20 and dimensions of the respective parts thereof were as follows.
Length of deposition mask 20: 870 mm
Width of deposition mask 20: 66.5 mm
Dimension of effective part 21 in first direction D1: 112.8 mm
Dimension of effective part 21 in second direction D2: 63.5 mm
Opening ratio of openings 25 in effective part 21: 20% to 60%, e.g., 39%
Opening dimension S1 of opening 25 in first surface 20a: 29 µm
Opening dimension S2 of opening 258 in second surface 20b: 34 µm Note that the opening ratio is a ratio of a planar dimension of the openings 25 relative to the whole planar dimension of the effective part 21.

Figures 23, 24:
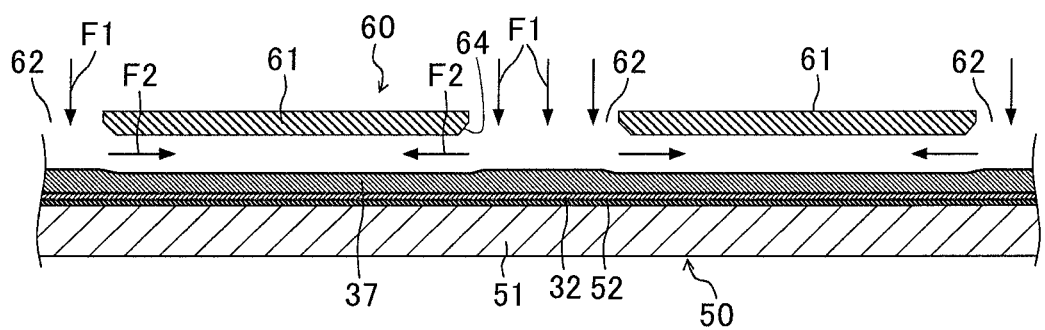
FIG. 23 is a view showing evaluation results of Examples 1 to 6 and Comparative Examples 1 to 3.
FIG. 24 is a sectional view showing a modification example of the shielding plate.

Following thereto, a thickness of the effective part 21 was measured. Specifically, as shown in FIG. 4, the effective part 21 was virtually divided into 9 areas. Thicknesses of the effective part 21 were measured at 9 locations in each of the 9 areas, i.e., at 81 locations in total. In addition, an average value and a standard deviation of the thickness measurement result at 72 locations in total in 8 areas of the 9 areas, which were adjacent to the outer frame part 24, were calculated as an average value T1 and a standard deviation 61 of the thickness of the outer peripheral area 22. In addition, an average value of the thickness measurement result at 9 locations in total in ninth area surrounded by the 8 areas constituting the peripheral area 22 was calculated as an average value T2 of the thickness of the central area 23. The results are shown in FIG. 23.

Here below, a measurement method of the thickness of the effective part 21 is described. Firstly, a sample was manufactured by cutting a part of the deposition mask 20. The sample had a rectangular shape with a long side of 150 mm and a short side of 80 mm. The sample included at least one effective part 21. Following thereto, the sample was placed on a black gel poly sheet attached to a glass plate having a thickness of 0.7 mm, and the sample was fixed. As the gel poly sheet, GPH100E82A04 manufactured by Panasonic Co., Ltd. was used.

Thereafter, the thicknesses of the effective part 21 included in the sample were measured at the aforementioned 81 locations. As a measurement apparatus for measuring the thickness, a laser microscope VK-8500 manufactured by Keyence Co., Ltd. was used. Specific measurement conditions were as follows.

RUN MODE: Black and white super depth
Measurement pitch: 0.05 μm
Objective magnification: 100 times Following thereto, deviation of positions of the openings 25 of the outer peripheral area 22 of the effective part 21 from the design was evaluated. As an apparatus for detecting a position of the opening 25, a large automatic two-dimensional coordinate measurement apparatus AMIC-1710D manufactured by SHINTO S-PRECISION, Ltd. was used. The number of openings 25 to be evaluated was 15. A maximum value of deviation amounts of positions of respective openings 25 from the design is shown in FIG. 23.

Examples 2 to 6

Deposition masks 20 were manufactured by a plating process similarly to the case of the Example 1, other than the plating process conditions. In addition, similarly to the case of the Example 1, deviation of positions of the openings 25 of the outer peripheral area 22 of the effective part 21 in the deposition masks 20 according to Examples 2 to 6 from the design were evaluated. Results are shown in FIG. 23.

Comparative Examples 1 to 3

A deposition mask 20 according to Comparative Example 1 was manufactured by a plating process similarly to the case of Example 1, other than that the shielding plate 60 was not used in the plating process. In addition, a deposition mask 20 according to Comparative Example 2 was manufactured by a plating process similarly to the case of Example 3, other than that the shielding plate 60 was not used in the plating process. In addition, a deposition mask 20 according to Comparative Example 3 was manufactured by a plating process similarly to the case of Example 5, other than that the shielding plate 60 was not used in the plating process. In addition, similarly to the case of the Example 1, deviation of positions of the openings 25 of the outer peripheral area 22 of the effective part 21 in the deposition masks 20 according to Comparative Examples 1 to 3 from the design were evaluated. Results are shown in FIG. 23.

As shown in FIG. 23, in Examples 1 to 6 in which the plating solution was supplied with the use of the shielding plate 60, the average value T2 of the thicknesses the central area 23 was larger than the average value T1 of the thicknesses of the outer peripheral area 22. On the other hand, in Comparative Examples 1 to 3 in which the plating solution was supplied without using the shielding plate 60, the average value T2 of the thicknesses of the central area 23 was equal to the average value T1 of the thicknesses of the outer peripheral area 22. Thus, by supplying the plating solution with the use of the shielding plate 60, the average value T2 of the thicknesses of the central area 23 could be made larger than the average value T1 of the thicknesses of the outer peripheral area 22.

As shown in FIG. 23, in Examples 1 to 6, the maximum values of the displacement amount of the position of the opening 25 were smaller than those of Comparative Examples 1 to 3. It can be said that to make the average value T2 of the thicknesses of the central area 23 larger than the average value T1 of the thicknesses of the outer peripheral area 22 is effective in reducing the deviation amounts of positions of the openings 25.

In Examples 1, 3 and 5, the following relational expressions were satisfied.

$$T1 < T2 \tag{4}$$

$$3\sigma 1 < T2/2 \tag{5}$$

On the other hand, in Examples 2, 4 and 6, the aforementioned relational expressions (4) and (5) were not satisfied. In Examples 1, 3 and 5, the plating solution was supplied with the use of the shielding plate 60 configured such that the plating solution flow in the area corresponding to the outer peripheral area 22 was more uniform as compared with the cases of Examples 2, 4 and 6. To be specific, in Examples 1, 3 and 5, as shown in FIG. 24, the end of a sidewall of the through-part 62 of the shielding plate 60 positioned toward the base member 51 included an inclined surface 64 that was inclined with respect to the normal direction of the base member 51. Thus, it can be considered that that a flow rate of the plating solution, which had passed the opening 62 and flowed toward an area on the base member 51, which corresponded to the outer peripheral area 22, could be suppressed from being varied, whereby the standard deviation σ1 of the thicknesses of the outer peripheral area 22 could be smaller.

In Examples 1, 3 and 5, the maximum value of deviation amounts of positions of the openings 25 was 5 μm or less. On the other hand, in Examples 2, 4 and 6, the maximum value of deviation amounts of positions of the openings 25 exceeded 5 μm. To constitute the outer peripheral area 22 and the central area 23 of the effective part 21 so as to satisfy the aforementioned relational expressions (4) and (5) can be a useful barometer for decreasing the deviation amounts of positions of the openings 25.

As a method for making uniform the flow of the plating solution in the area corresponding to the outer peripheral area 22, various methods can be conceived other than the provision of the inclined surface 64 on the end of the wall surface of the through-part 62 of the shielding plate 60 as described above. For example, a distance between the base member 51 and the shielding plate 60 may be adjusted. The larger the distance between the base member 51 and the shielding plate 60 is, the more the plating solution is likely to be supplied to an area of the base member 51, which is not overlapped with the shielding plate 60. Thus, it can be suppressed that a flow rate of the plating solution toward the area corresponding to the outer peripheral area 22 varies. On the other hand, when the distance between the base member 51 and the shielding plate 60 is too large, the effect of the shielding plate 60 for restraining the supply of the plating solution to the outer peripheral area 22 diminishes. Thus, it is preferable that the distance between the base member 51 and the shielding plate 60 is suitably adjusted within a range that satisfies the aforementioned relational expressions (4) and (5).

The invention claimed is:

1. A deposition mask comprising:
    an effective part including center openings and outermost openings; and
    an outer frame part surrounding the effective part;

wherein the openings are arranged in the effective part along two directions orthogonal to each other at respective predetermined pitches, wherein the outer frame part s not provided with openings, or a distribution density of openings in the outer frame part is lower that a distribution density of the openings in the effective part, wherein the effective part includes an outer peripheral area that encompasses the outermost openings and borders the outer frame part, and a central area that is surrounded by the outer peripheral area and that has a thickness larger than a thickness of the outer peripheral area, wherein the effective part includes 9 areas which are obtained by virtually trisecting the effective part respectively along a first direction and a second direction orthogonal to the first direction, with 8 areas out of the 9 areas adjacent to the outer frame part constituting the outer peripheral area, and the remaining 1 area out of 9 areas constituting the central area;

wherein when an average value of the thicknesses of the outer peripheral area is represented as T1, a standard deviation of the thicknesses of the outer peripheral area is represented as σ1, and an average value of the thicknesses of the central area is represented as T2, the following relational expressions are satisfied:

$T1 < T2$; and $3\sigma 1 < T2/2$, wherein the average value T1 and the standard deviation σ1 of the thicknesses of the outer peripheral area are calculated based on thicknesses at 72 locations in the outer peripheral area, and the thicknesses at the 72 locations are obtained by measuring thicknesses at 9 locations in each of the 8 areas constituting the outer peripheral area;

the average value T2 of the thickness of the central area is calculated by measuring the thicknesses at 9 locations in the remaining 1 area constituting the central area; and wherein 81 locations including the 72 locations in the outer peripheral area and the 9 locations in the central area are distributed at a predetermined pitch in the effective part so as not to coincide with the openings.

2. The deposition mask according to claim 1, wherein:

the deposition mask includes a first surface positioned toward a substrate onto which deposition material having passed through the openings is deposited, and a second surface positioned opposite to the first surface; and the opening includes a first opening positioned on the first surface and a second opening positioned on the second surface; and the second opening includes a profile surrounding a profile of the first opening, when seen along a normal direction of the first surface.

3. The deposition mask according to claim 2, wherein the deposition mask comprises a metal layer comprising a first metal layer that is positioned on the first surface side and that includes the first opening formed therein, and a second metal layer that is positioned on the second surface side and that includes the second opening formed therein.

4. The deposition mask according to claim 3, wherein the metal layer is a plated layer.

5. The deposition mask according to claim 2, wherein the deposition mask comprises a metal layer including the openings formed therein; and a dimension of the opening of the metal layer in a plane direction of the first surface decreases from the second surface side toward the first surface side.

6. The deposition mask according to claim 5, wherein the metal layer is a plated layer.

7. The deposition mask according to claim 1, wherein:

the deposition mask comprises a plurality of the effective parts arranged side by side along a first direction; and a thickness of the central area of one of the effective parts, the one being closest to an end of the deposition mask in the first direction, is larger than a thickness of the central area of one other effective part being closest to a center of the deposition mask in the first direction.

8. A method of manufacturing the deposition mask according to claim 1, comprising:

a plating step of supplying a plating solution so as to form the outer peripheral area and the central area;

wherein the plating solution is supplied through a shielding plate including a shielding part and a through-part, the shielding part being overlapped with the outer peripheral area, the through-part being overlapped with the central area.

* * * * *